(12) United States Patent
Kertesz (10) Patent No.: US 11,545,448 B2
(45) Date of Patent: Jan. 3, 2023

(54) MOISTURE-RESISTANT ELECTRONIC COMPONENT AND PROCESS FOR PRODUCING SUCH A COMPONENT

(71) Applicant: THALES, Courbevoie (FR)

(72) Inventor: Philippe Kertesz, Elancourt (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/924,144

(22) Filed: Jul. 8, 2020

(65) Prior Publication Data

US 2021/0013161 A1 Jan. 14, 2021

(30) Foreign Application Priority Data

Jul. 11, 2019 (FR) ...................................... 1907784

(51) Int. Cl.
*H01L 21/48* (2006.01)
*H01L 23/538* (2006.01)
(Continued)

(52) U.S. Cl.
CPC ........ *H01L 23/564* (2013.01); *H01L 21/4853* (2013.01); *H01L 21/4857* (2013.01);
(Continued)

(58) Field of Classification Search
CPC ............... H01L 23/564; H01L 21/4857; H01L 21/4871; H01L 23/5383; H01L 23/5386; H01L 23/5389; H01L 23/552; H01L 21/4853; H01L 21/54; H01L 21/56; H01L 21/565; H01L 23/24; H01L 23/293; H01L 23/3128; H01L 23/3675; H01L 23/5384; H01L 23/60; H01L 23/66; H01L 24/17; H01L 24/19; H01L 24/20; H01L 24/50; H01L 24/83
(Continued)

(56) References Cited

U.S. PATENT DOCUMENTS 6,060,778 A * 5/2000 Jeong ...................... H01L 23/13
257/710
2008/0017409 A1 1/2008 Takeuchi et al.
(Continued)

FOREIGN PATENT DOCUMENTS

EP 3 089 211 A1 11/2016
FR 2 849 346 A1 6/2004
FR 2 877 537 A1 5/2006

*Primary Examiner* — Didarul A Mazumder
(74) *Attorney, Agent, or Firm* — BakerHostetler (57) ABSTRACT

An electronic component includes a first set comprising an interconnect layer and an electronic circuit having a front face and a back face, which is connected to the interconnect layer by the front face, wherein the first set comprises a metal plate having a front face and a back face joined to the back face of the electronic circuit; a coupling agent between the front face of the metal plate and the back face of the electronic circuit, configured to thermally and electrically connect the metal plate to the electronic circuit; and in that the electronic component comprises: one or more layers made of organic materials stacked around the first set and the metal plate using a printed circuit-type technique and encapsulating the electronic circuit; a thermally conductive metal surface arranged at least partially in contact with the back face of the metal plate.

8 Claims, 5 Drawing Sheets

(51) Int. Cl.
    *H01L 23/00*     (2006.01)
    *H01L 23/367*    (2006.01)
    *H01L 23/552*    (2006.01)

(52) U.S. Cl.
    CPC ........ *H01L 21/4871* (2013.01); *H01L 23/367* (2013.01); *H01L 23/5383* (2013.01); *H01L 23/5386* (2013.01); *H01L 23/5389* (2013.01); *H01L 23/552* (2013.01)

(58) Field of Classification Search
    USPC ...................................................... 257/659
    See application file for complete search history.

(56) References Cited

U.S. PATENT DOCUMENTS

| | | |
|---|---|---|
| 2012/0069288 A1 | 3/2012 | Das et al. |
| 2014/0160699 A1 | 6/2014 | Zhang et al. |
| 2014/0342679 A1 | 11/2014 | Choudhury et al. |
| 2016/0322315 A1* | 11/2016 | Kertesz ................. H01L 24/20 |

* cited by examiner

MOISTURE-RESISTANT ELECTRONIC COMPONENT AND PROCESS FOR PRODUCING SUCH A COMPONENT

CROSS-REFERENCE TO RELATED APPLICATIONS

This application claims priority to foreign French patent application No. FR 1907784, filed on Jul. 11, 2019, the disclosure of which is incorporated by reference in its entirety.

FIELD OF THE INVENTION

The present invention relates to an electronic component, in particular a radiofrequency component, that is resistant to moisture. It also relates to a process for producing an electronic component, in particular a radiofrequency component.

The field of the invention is in particular that of radiofrequency microelectronics packaging, especially for producing radiofrequency packages that include shielding that is integrated and resistant to moisture. These packages are for example used in complex radiofrequency equipment such as airborne radar. More generally, the field of application is that of narrowband or wideband radiofrequency equipment, the packages being usable in all high-frequency applications, even those with high signal integrity specifications.

BACKGROUND

The currently proposed moisture-resistant radiofrequency packaging technologies rely on the use of inorganic materials or on encapsulation of the components using injected organic resins. The inorganic solutions employ in particular sealed metal packages with glass beads for the inputs/outputs or ceramics.

The solutions using inorganic materials have several drawbacks. In particular, what is obtained are:
  heavy and expensive packages, due to the metal or ceramic materials used;
  bulky solutions, using in particular packages with internal cavities, very often with peripheral interconnections;
  solutions for which the reliability of mounting, in the equipment in question, is generally problematic, because of differences in expansion coefficient with the printed circuit boards to which they are joined.

In the case of injected organic packaging, the end result is objects which are generally intrinsically unshielded electrically and which therefore cannot be used as they are in complex equipment where crosstalk is a critical parameter. The package usually encountered is what is known the QFN (quad flat no-lead) package which has generally peripheral inputs and outputs.

There is a need for compact packages that comply with the following constraints:
  protecting the encapsulated functions from moisture, in particular to take all of the MMIC (microwave monolithic integrated circuit) technologies into account;
  obtaining good reliability of mounting;
  retaining the possibility of changing the packages on the board;
  being suitable for dissipating heat;
  having 3D capability, that is to say, according to the architecture, even with ultra-compact packages, stacking radiofrequency functions according to the integration density of the chips used.

Radiofrequency applications require the use of III-V semiconductors with high charge mobility. These components operate in analogue mode and are therefore very sensitive to the quality of the interconnections that they use and to the interference that they may encounter. In addition, since they operate at significant voltages and currents, the electronic components (transistors, capacitors, resistors, etc.) may be subject to corrosion effects when they are in operation, for example electrochemical corrosion through difference in Nernst potential.

To avoid any problem of reliability, manufacturers first developed sealed packages that use inorganic materials (metals or ceramics as mentioned previously) which are heavy and bulky. In order to decrease the weight, the volume and the cost of manufacturing of the radiofrequency packaging, plastic packages have begun to be developed with a loss of electromagnetic performance that is substantial but acceptable for narrowband applications such as mobile telephony.

The field of electronics packaging has been the subject of numerous developments. The BGA (ball grid array)-type package with surface interconnections was developed in response to the QFP (quad flat pack) technology with peripheral interconnections in order to increase the interconnection density. This BGA-type package has experienced substantial growth for silicon semiconductor-based digital applications.

In the field of radiofrequency organic packaging, many solutions have also been developed. Solutions that may be cited include CSP (chip scale package) technology for narrowband applications with an operational frequency below 2.17 GHz. Plastic packages capable of managing heat dissipation of about 60 W to 100 W have also been developed for applications ranging up to 2.17 GHz. There are QFN-type plastic packages for high-frequency applications, up to 35 GHz, in narrowband. QFN- or TSOP (thin small outline package)-type plastic packages operate up to 12 GHz. A package with a cavity using a thermoplastic material referred to as LCP (liquid crystal polymer) was developed at the end of the 2000s for high-frequency applications. During the same period, the concept of packaging for radiofrequency applications using LTCC (low temperature cofired ceramic) technology and LCP organic materials emerged. The QFP (quad flat pack)-type package, with a cavity, has allowed encapsulation of a wideband function with satisfactory performance.

Additionally, patent applications FR 2849346 and FR 2877537 describe BGA organic packaging technology with a cavity.

As has been mentioned previously, the only moisture-resistant radiofrequency packaging technologies that are compatible with all of the MMICs rely on the use of inorganic materials (metal packages with glass beads for the inputs and outputs or ceramic packages), or on the encapsulation of the components using injected organic resins. The solutions based on inorganic materials lead to the use of heavy and expensive packages, and are bulky, particularly because of the internal cavities and the peripheral interconnections. The solutions based on organic materials have the major drawback of not being electrically shielded, and therefore cannot be used in complex equipment where crosstalk is a critical parameter without additional partitioning.

Document EP 3089211 describes an electronic component comprising an electronic circuit and a stack of layers made of organic materials forming a cavity on a carrier, the electronic circuit being housed in the cavity filled with a material exhibiting low permeability to water vapour. This component complies with the constraints mentioned above. However, this component requires a structure with a dual mechanical reference related to the bonding of the back face of the encapsulated circuit. This structure is necessary for the electrical ground connection used by the component for operation and for contact with a heat sink in order to efficiently remove the heat produced by the circuit during its operation. This structure represents a mechanical difficulty which is overcome by means of a step of deforming the interconnect layer, making it possible to solve the problem of a dual mechanical reference during lamination. The deformation step is difficult to implement since it may cause damage to the connections of the encapsulated circuit.

SUMMARY OF THE INVENTION

The invention aims to overcome all or some the problems mentioned above by providing both an electronic component that is highly resistant to moisture capable of encapsulating AsGa (gallium arsenide) and GaN (gallium nitride) semiconductors in a high-performance manner, with integrated shielding, and a process for producing such a component that is easy to implement and without a risk of damaging the connections of the electronic circuits encapsulated in the component.

To this end, the subject of the invention is an electronic component comprising a first set comprising an interconnect layer and an electronic circuit having a front face and a back face, which is connected to the interconnect layer by the front face, the first set comprising:
  a. a metal plate having a front face and a back face joined to the back face of the electronic circuit;
  b. a coupling agent between the front face of the metal plate and the back face of the electronic circuit, configured to thermally and electrically connect the metal plate to the electronic circuit;
and the electronic component comprising:
  c. one or more layers made of organic materials stacked around the first set using a printed circuit-type technique and encapsulating the electronic circuit;
  d. a thermally conductive metal surface arranged at least partially in contact with the back face of the metal plate.

Advantageously, the electronic component comprises an array of metal elements arranged at a distance from the electronic circuit so as to form a Faraday cage containing the electronic circuit.

Advantageously, the array of metal elements is arranged on the perimeter of the electronic component.

Advantageously, the array of metal elements is arranged on the periphery of the electronic component.

Advantageously, at least one of the one or more layers made of organic materials is a layer made of thermoplastic material.

The invention also relates to a process for producing an electronic component comprising a first set comprising an interconnect layer and an electronic circuit having a front face and a back face, which is connected to the interconnect layer by the front face, the process comprising the following steps:
  a. joining a metal plate having a front face and a back face to the back face of the electronic circuit;
  b. thermally and electrically coupling the metal plate to the electronic circuit using a coupling agent between the front face of the metal plate and the back face of the electronic circuit;
  c. stacking one or more layers made of organic materials around the first set and the metal plate using a printed circuit-type technique and encapsulating the electronic circuit forming an assembly;
  d. laminating the assembly;
  e. producing a thermally conductive metal surface arranged at least partially in contact with the back face of the metal plate.

Advantageously, the production process according to the invention comprises a step of producing shielding for the electronic circuit using an array of metal elements arranged at a distance from the electronic circuit so as to form a Faraday cage containing the electronic circuit.

Advantageously, the step of producing shielding for the electronic circuit comprises a step of arranging the array of metal elements on the perimeter of the electronic component.

Advantageously, the step of producing shielding for the electronic circuit comprises a step of arranging the array of metal elements on the periphery of the electronic component.

Advantageously, the step of producing the thermally conductive metal surface arranged at least partially in contact with the back face of the metal plate comprises a step of machining the electronic component towards the back face of the metal plate and a metallization step.

BRIEF DESCRIPTION OF THE DRAWINGS

The invention will be better understood and further advantages will become apparent upon reading the detailed description of one embodiment provided by way of example, which description is illustrated by the attached drawing, in which.

For the sake of clarity, these figures are not all to the same scale. Moreover, the same elements will bear the same references in various figures.

DETAILED DESCRIPTION

Figure 1:
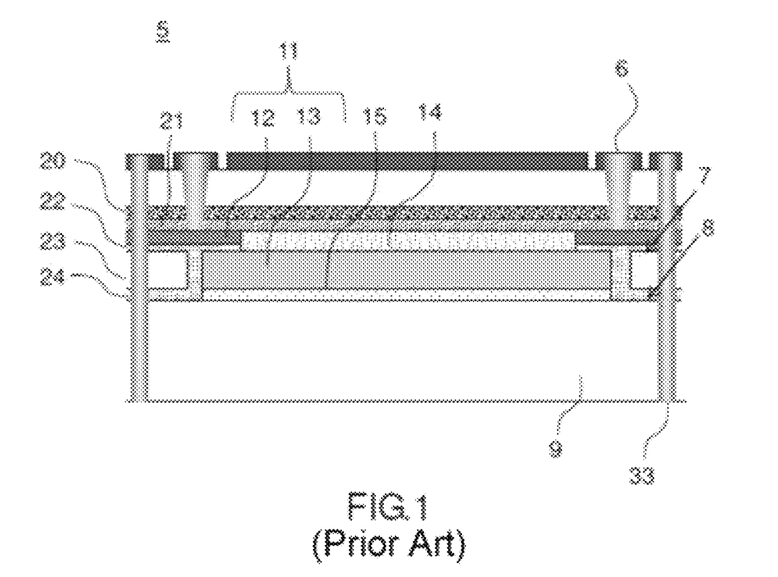
FIG. 1 schematically shows a sectional view of an electronic component known from the prior art.

FIG. 1 schematically shows a sectional view of an electronic component 5 known from the prior art. The electronic component 5 comprises a carrier 9 to which is attached a first set 11 comprising an interconnect layer 12 and an electronic circuit 13 having a front face 14 and a back face 15, which is connected to the interconnect layer 12 by the front face 14. It additionally comprises one or more layers made of organic materials 20, 21, 22 and 23 stacked on the carrier 9. The electronic circuit 13 is enclosed in the set of these layers after manufacture, interconnected to the outside by the structures 6. Similarly, the structures 33 arranged suitably around electronic circuit 13 constitute a Faraday cage for protection from all outside interference.

This electronic component 5 of the prior art has a drawback in a dual mechanical reference (7, 8) related to the bonding of the back face of the circuit. This structure is necessary since, to operate, the electronic circuit needs to be connected to ground via its back face 15, and for contact with a heat sink (represented by reference 9, which may also act as a carrier) in order to efficiently remove the heat produced by the electronic circuit during its operation. In the process for producing such a component, the heat sink 9 and the layers 21, 22 are stacked so as to form a cavity for the circuit 13, and then the first set 11 is positioned. Depending on the height of the layers 21, 22, 23 around the cavity and depending on the height of the circuit 13 and of its connection points, it is not possible to guarantee that the back face 15 presses against the adhesive. Specifically, there are mechanical tolerances for each element. Depending on these tolerances, the circuit 13 may not be in contact with the adhesive at the bottom of the cavity. To ensure the bonding of the circuit 13 at the bottom of the cavity, a step of deforming the interconnect layer 12 is necessary, by pressing the first set 11 towards the heat sink 9. In this deformation step, the connections of the electronic circuit 13 may be damaged. The electronic circuit 13 itself may be damaged. Additionally, by applying pressure to the stack, adhesive may leak over the sides of the electronic circuit 13 and lead to a short circuit. The thickness between the back face 15 of the circuit 13 and the adhesive before stacking is not completely controlled. The mechanical tolerances make such a production process troublesome and difficult to control.

Figure 2:
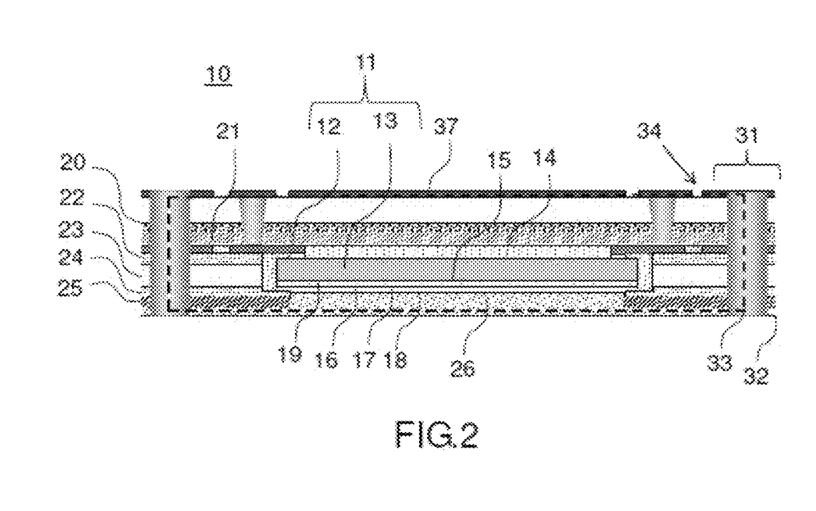
FIG. 2 schematically shows a sectional view of an electronic component according to the invention.

FIG. 2 schematically shows a sectional view of an electronic component 10 according to the invention. The electronic component 10 comprises a first set 11 comprising an interconnect layer 12 and an electronic circuit 13 having a front face 14 and a back face 15, which is connected to the interconnect layer 12 by the front face 14. According to the invention, the first set 11 comprises a metal plate 16 having a front face 17 and a back face 18, joined to the back face 15 of the electronic circuit 13 by a coupling agent 19 between the front face 17 of the metal plate 16 and the back face 15 of the electronic circuit 13, which is configured to thermally and electrically connect the metal plate 16 to the electronic circuit 13. The electronic component 10 comprises one or more layers made of organic materials 20, 21, 22, 23, 24, 25 stacked around the first set 11 using a printed circuit-type technique and encapsulating the electronic circuit 13. The layer 25 is a lower closing layer which includes a sheet of copper which has been bonded on top beforehand by the material supplier or the package manufacturer. Lastly, the electronic component 10 comprises a thermally conductive metal surface 26 arranged at least partially in contact with the back face 18 of the metal plate 16. Metallized holes 33 pass through the periphery of the component in order to electrically connect the conductive plane 26 forming the heat sink with the upper conductive plane 37 capable of supporting external connection balls.

The metal plate 16 protects the back face 15 of the electronic circuit 13 during the process of producing the component 10, it participates in the ground connection, and it also participates in the thermal dissipation of the heat produced by the electronic circuit 13 during its operation. In FIG. 2, the area of the metal plate 16 is substantially equal to that of the back face of the electronic circuit 13. However, its area could be smaller than or equal to that of the back face of the circuit 13 in order to facilitate its placement, or else larger in order to allow interconnections to be made in the region where the electronic circuit 13 is not present. This latter variant also allows the area of contact with the metal surface 26 to be increased, and hence promotes heat dissipation.

The electronic circuit 13 may be an MMIC (monolithic microwave integrated circuit)-type radiofrequency circuit. One of the layers, for example the layer 20, 21, 22, 23, 24, 25, may be made of LCP thermoplastic material, i.e. of a liquid crystal polymer. This material exhibits very low permeability to water vapour. The use of an LCP-type thermoplastic material of intrinsically very low hydrophilicity makes it possible, when it is deformed during the production process, to fill the cavities that may already be present between the various layers and thus obtain stacks that are uniform and resistant to water penetration. Additionally, at its melting point, the LCP becomes quasi-liquid and no longer exerts any mechanical stress. This property makes it possible to preserve the integrity of fragile radiofrequency structures such as the air bridges found in many MMIC-type circuits. Additionally, the use of thermoplastic materials in the production of such a component makes it possible to fill in all of the defects, i.e. cavities, interstices, differences in evenness, in the stack during its manufacture. In association with rigid thermosetting materials, the use of thermoplastic materials guarantees that mechanical dimensions essential to the operation of the electronic component are maintained. Moreover, the use of materials specifically developed for high-frequency uses allows the design of wideband radiofrequency packages. In other words, the electronic semiconductor component 10 according to the invention is "enclosed" in a stack of layers of various plastic materials: some of these layers are made using materials that are dimensionally "stable" in the temperature range used during the manufacturing process, and some of these layers "melt" during the rise in temperature of the manufacturing process: during this phase in which they are "molten", these layers fill in all of the interstices which remain with the component and the stack. When the temperature returns to normal, the layers become rigid again: what is obtained then is a stack very close to that at the start, but with its holes, gaps and interstices present filled in.

The coupling agent 19 may be an adhesive providing thermal and electrical coupling between the circuit 13 and the metal plate 16. It may also be a metal alloy solder.

Advantageously, the electronic component 10 comprises an array 31 of metal elements 32, 33 arranged at a distance from the electronic circuit 13 so as to form a Faraday cage 34 containing the electronic circuit 13. The Faraday cage 34 is thus formed between the elements 32, 33 and the lower 26 and upper 37 ground planes. In FIG. 2, the Faraday cage is (partly) represented by dashed lines.

Figure 3:
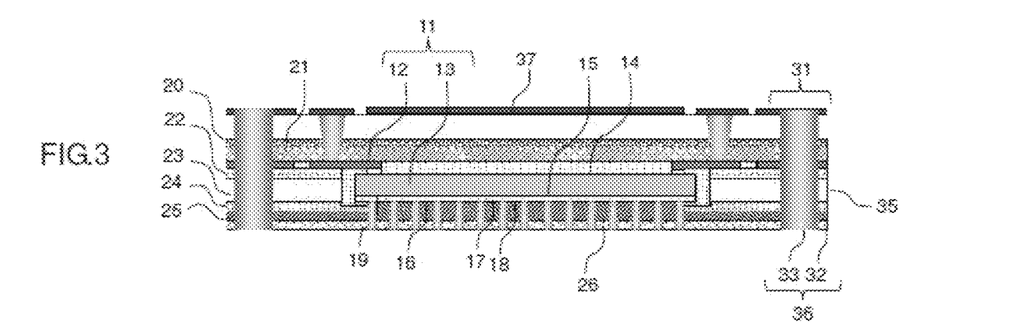
FIG. 3 schematically shows a sectional view of one embodiment of an electronic component according to the invention.
Figure 10:
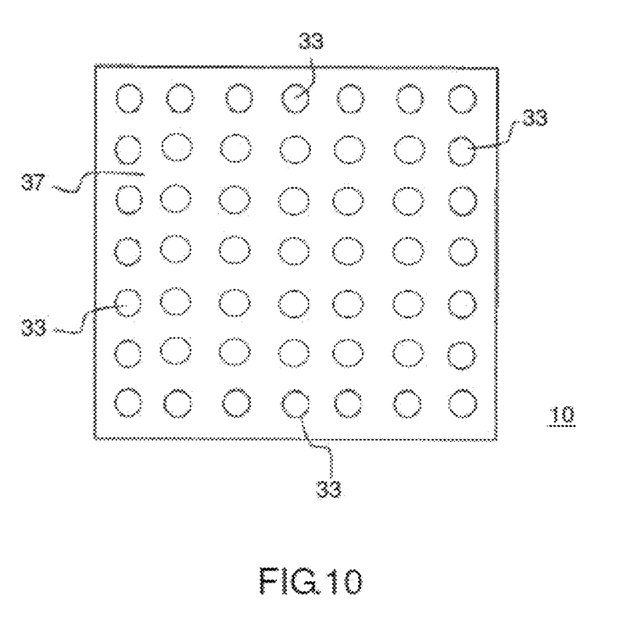
FIG. 10 illustrates a view from above of the electronic component according to one exemplary embodiment of the invention.

FIG. 3 schematically shows a sectional view of one embodiment of an electronic component 10 according to the invention. In this embodiment, the array 31 of metal elements 32 is arranged on the perimeter 35 of the electronic component 10, i.e. on the outer lateral periphery of the electronic component 10, for example by depositing a metallized layer on the outer surface of the component, thus forming a true shielding wall. The outer lateral periphery corresponds to the surface of the component extending along a plane that is substantially perpendicular to the joining plane of the component, for example and for illustration perpendicular to the interconnect layer 12. It can be noted that the array 31 of metal elements 33 may also be arranged on the periphery 36 of the electronic component, for example by means of metallized through-holes 33. A component according to the invention may comprise either of the variants of metal elements, or even both variants. In the case of metallized through-holes 33, there may be two or more rows thereof, in a staggered arrangement. Metallized holes 33 pass through the periphery of the component in order to electrically connect the conductive plane 26 forming the heat sink with the upper conductive plane 37 capable of supporting external connection balls. These holes are arranged around the entire periphery 36 of the component, for example regularly, in order to form a Faraday cage delimited by the upper conductive plane 37 and the conductive plane 26 and by the array of metallized holes 33. FIG. 10 illustrates, via a view from above of the component 10, an exemplary arrangement of these holes 33 on the surface. What is obtained is thus packaging that is intrinsically shielded by the formation of an internal Faraday cage coupled in a quasi-coaxial interconnection mode.

The thermally conductive metal surface 26 arranged in contact with the layer 25 may be at least partially connected to the back face 18 of the metal plate 16 and may form a surface electrical contact over the entire area of the metal plate 16 (as shown in FIG. 2), over part of the area of the metal plate 16 and/or may have an area larger than that of the metal plate 16. The metal surface 26 may also consist of a set of filled metallized holes, forming a plurality of surface contacts. This metal surface may consist of copper, as explained above in the illustration of the process for producing such a component.

Figure 4:
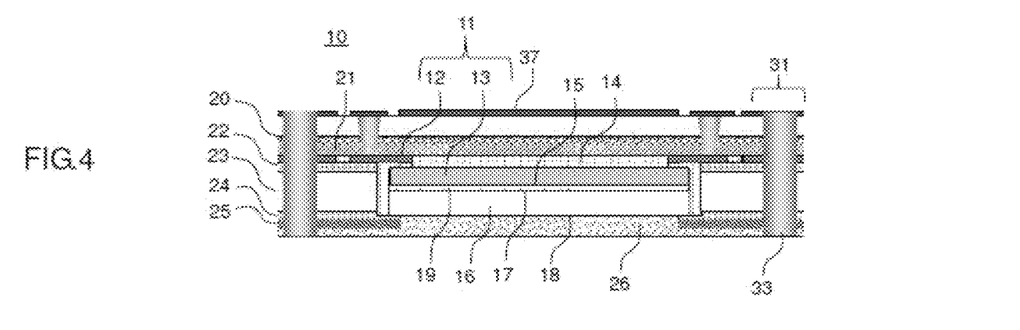
FIG. 4 schematically shows a sectional view of another embodiment of an electronic component according to the invention.

FIG. 4 schematically shows a sectional view of another embodiment of an electronic component 10 according to the invention. In this embodiment, the thickness of the metal plate 16 is greater than that of the components of the embodiments presented in FIGS. 2 and 3. This results in a thicker final heat sink, which is particularly advantageous if greater heat dissipation is required.

Figure 5:
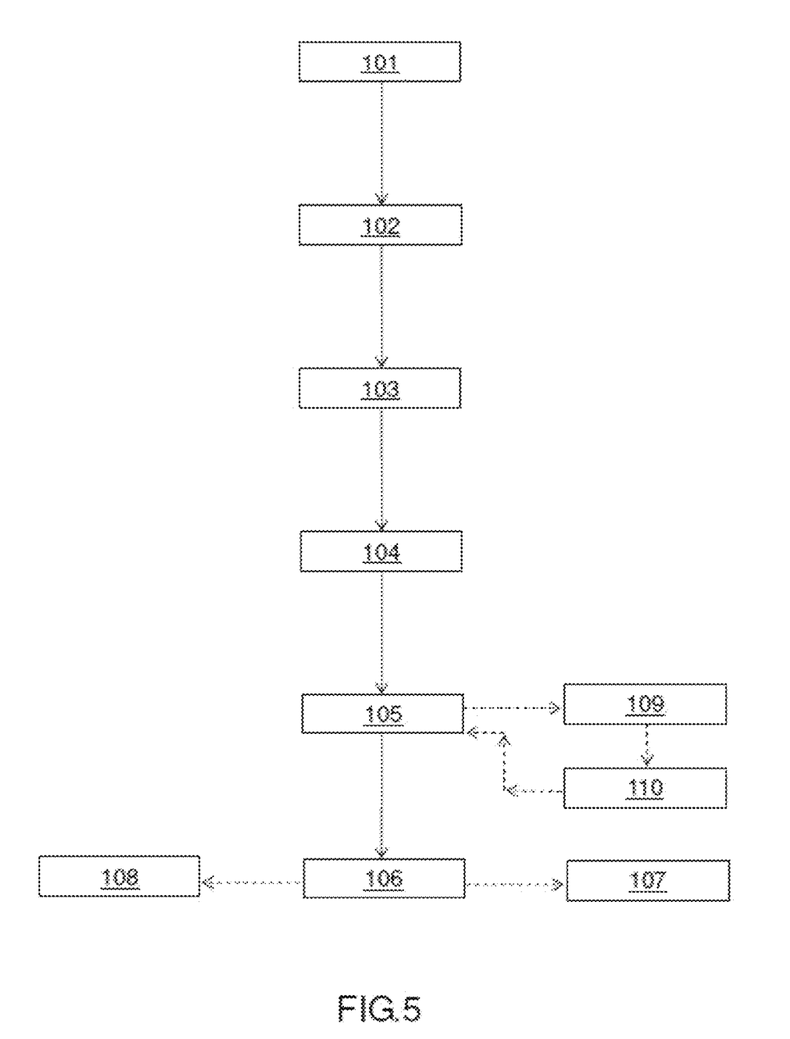
FIG. 5 schematically shows the steps of a process according to the invention.

FIG. 5 schematically shows the steps of a process according to the invention. The process for producing an electronic component 10 comprising a first set 11 comprising an interconnect layer 12 and an electronic circuit 13 having a front face 14 and a back face 15, which is connected to the interconnect layer 12 by the front face 14, comprises a step 101 of joining a metal plate 16 having a front face 17 and a back face 18 to the back face 15 of the electronic circuit 13. After wiring the electronic circuit 13 to the interconnect layer 12, a metal plate 16 is connected on the back face of the electronic circuit 13. This metal plate 16 performs two functions: first, it protects the back face of the electronic circuit 13 during the process (in particular when machining the component at the end of the process as described below), and it allows thermomechanical adjustment of the interface created with the organic materials that are to be bonded on top thereof. For example, the metal plate 16 may be made of copper, of gold-plated copper, of diamond, etc.

The process according to the invention comprises a step 102 of thermally and electrically coupling the metal plate 16 to the electronic circuit 13 using a coupling agent 19 between the front face 17 of the metal plate 16 and the back face 15 of the electronic circuit 13. The thermal and electrical coupling may for example be carried out by means of an adhesive or a solder. It then comprises a step 103 of stacking one or more layers made of organic materials 20, 21, 22, 23, 24, 25 around the first set 11 using a printed circuit-type technique and encapsulating the electronic circuit 13 forming an assembly 27. The production process comprises a step 104 of laminating the assembly 27, i.e. a step of pressing and heating the assembly 27. This step allows the films of adhesive to melt and ensures the uniformity of the stack. At this stage in the process according to the invention, there is no heat sink positioned beneath the electronic component 10. There is a plurality of layers made of organic materials arranged around the first set formed by the circuit 13 and the interconnect layer 12. In lamination step 104, the thermoplastic adhesive fills the spaces left free in the preceding steps during the stacking step. After lamination step 104, the electronic circuit 13 is embedded in the thermoplastic material, for example the LCP or the FEP (abbreviation for fluorinated ethylene propylene), which ensures its later protection from moisture.

Lastly, the process according to the invention comprises a step 105 of producing a thermally conductive metal surface 26 arranged at least partially in contact with the back face 18 of the metal plate 16. This step is needed to reconnect the back face of the electronic circuit 13. Specifically, this back face 18 of the metal plate 16 was also embedded in the LCP thermoplastic layer during the production process.

Figure 6:
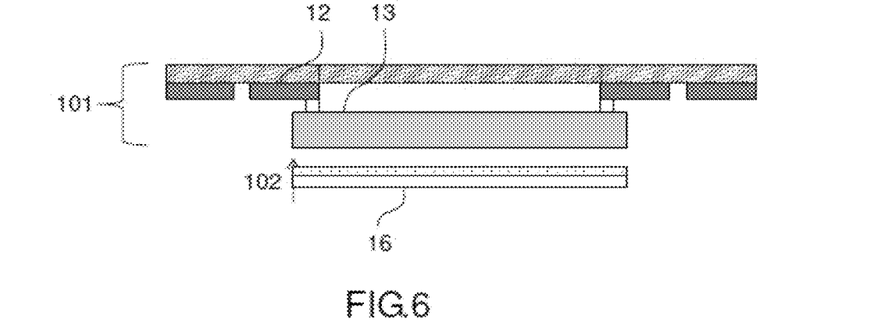
FIG. 6 schematically shows the joining and coupling steps of the process according to the invention.

FIG. 6 schematically shows the joining 101 and coupling 102 steps of the process according to the invention.

Figure 7:
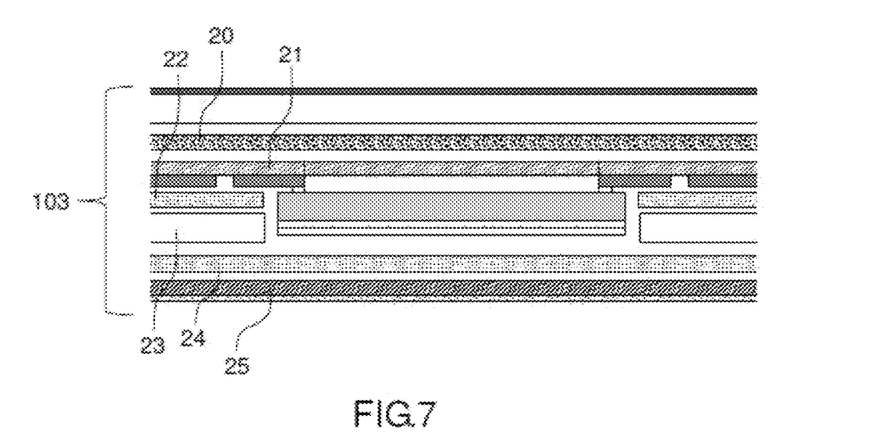
FIG. 7 schematically shows the stacking step of the process according to the invention.

FIG. 7 schematically shows the stacking step 103 of the process according to the invention. FIGS. 6 and 7 are schematic and aim to show the layers separately during their assembly. By way of explanation, the interconnect layer 12 is, once assembly has been carried out, well surrounded on all sides by the organic layers.

Figure 8:
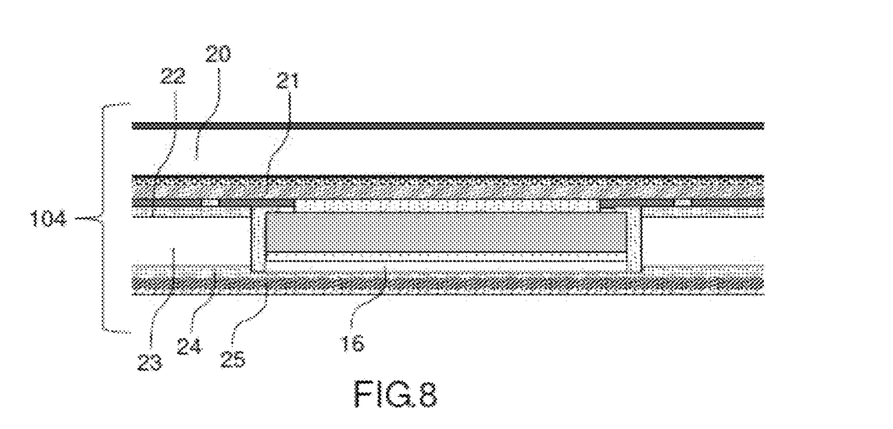
FIG. 8 schematically shows the lamination step of the process according to the invention.

FIG. 8 schematically shows the lamination step 104 of the process according to the invention.

Advantageously, the process according to the invention comprises a step 106 of producing shielding for the electronic circuit 13 using an array 31 of metal elements 32, 33 arranged at a distance from the electronic circuit 13 so as to form a Faraday cage 34 containing the electronic circuit 13. Step 106 of producing shielding for the electronic circuit 13 may comprise a step 107 of arranging the array 31 of metal elements 32 on the perimeter 35 of the electronic component 10 and/or a step 108 of arranging the array 31 of metal elements 33 on the periphery 36 of the electronic component 10. The metallized holes, which are made between the upper face and the lower face of the stack, allow a Faraday cage to be created, and also allow the back ground of the semiconductor to be connected to the upper face of the stack.

Figure 9:
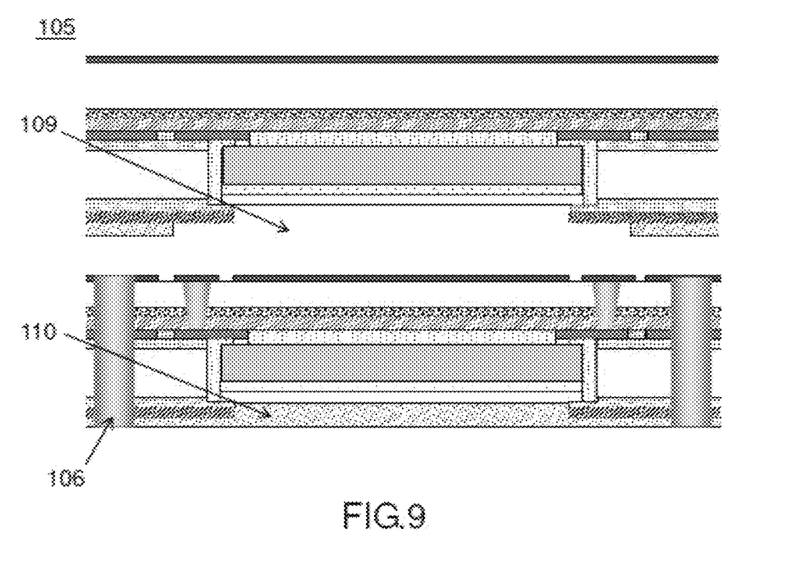
FIG. 9 schematically shows the steps of producing a thermally conductive metal surface and of producing shielding for the electronic circuit of the process according to the invention.

FIG. 9 schematically shows the steps of producing 105 a thermally conductive metal surface and of producing 106 shielding for the electronic circuit of the process according to the invention.

The step 105 of producing the thermally conductive metal surface 26 arranged at least partially in contact with the back face 18 of the metal plate 16 comprises a step 109 of machining the electronic component 10 towards the back face 18 of the metal plate 16 and a metallization step 110. As explained above, the back face of the electronic circuit 13 is embedded in the thermoplastic layer. It is therefore needed to reconnect the back face of the electronic circuit 13. The machining of the electronic component 10 may be performed by piercing suitably arranged holes or by milling (as shown in FIG. 9), performed using a laser, or any other suitable, for example mechanical, process. This production process implementing a step of machining the component is made possible because the layers of dielectrics arranged beneath the metal plate 16 are thin enough to avoid any problems. Additionally, the metal plate 16 provides protection for the back face of the circuit 13 during the machining step 109. The use of a $CO_2$ laser suits this type of process since it pyrolyses organic materials and is reflected by metals (and therefore by the metal plate 16). Depending on the required heat dissipation needs, it is possible either to remove almost all of the surface beneath the electronic circuit 13 (as shown in FIG. 2), or to create connections via laser holes (as shown in FIG. 3).

After machining step 109, step 110 of metallizing the machined surface takes place. In this step, the material removed is replaced with a metal containing copper. Advantageously, this metallization step comprises a first step of metallization in a solution for the deposition of a few micrometres of copper, then a second step of electrolytic surfacing in order to deposit a greater thickness of copper.

What is obtained is thus a stack allowing optimized operation for the encapsulated electronic circuit 13, both electrically and thermally. Another advantage resulting from the process according to the invention is that the encapsulated electronic circuit 13 is not subjected to any mechanical stresses during the implementation of the process. After cutting and balling, the package obtained may be used and exhibits good electrical properties and good moisture resistance, with significantly improved reliability in comparison with the components of the prior art.

Unlike the packaging process described in document EP 3089211, the production process according to the invention does not address the dual mechanical reference problem in the lamination step. The process according to the invention takes a different approach, by dealing with the dual mechanical reference in a later phase of the process by removing material beneath the component, i.e. on the back-face side of the electronic circuit 13. In other words, the process according to the invention does not provide a heat sink when stacking the layers around the electronic circuit 13, or the ground connection. The heat sink and the ground connection are produced later, after machining the component. In other words, in the prior art, the production of such a functional stack required that the back face of the semiconductor be bonded to the outer lower metal layer. It is this bonding which introduces mechanical stresses onto the semiconductor, since the differences in heights between the stack and the component meant pressing on the latter to ensure that it was bonded. The method of the invention makes it possible to avoid having to bond the semiconductor to an outer lower metal layer and thus to eliminate all of the mechanical stresses which occurred in the first process.

The process according to the invention has an advantage over using just using a plurality of LCP layers as in the prior art. Specifically, using a plurality of LCP layers is not enough to eliminate the need to press on the component to bond it. Being able to bond a metal plate to the component before placing same (and its layer including electrical connections) in the stack, as done in the invention, eliminates the need to press thereon: this plate will protect the component in the final phases of the manufacturing process. Specifically, after lamination, the back face of the stack is machined (by laser) up to the plate: in the absence thereof, there would be a real risk of destroying the component. Once an opening the size of the plate has been made, the steps are implemented for adding metal into the cavity made. In this way, the metal portion bonded to the component is located in the lower plane of the total stack. The final stack obtained then has additional features as a result of these modifications. The plate bonded to the back face of the component has been thickened and can therefore remove the heat which will be produced by the component during its operation. Additionally, the adhesive used is electrically conductive (but it would also be possible to join the component using a solder alloy to like effect), and thus allows the potential of the back face of the semiconductor to be transferred to the back face of the stack.

The invention thus relates to the electronic component directly obtained using the production process described above.

The production process according to the invention makes it possible to prevent any liquid moisture from penetrating the encapsulation of the electronic circuit 13, and therefore to eliminate any problem of electrochemical corrosion on the metal stacks of the circuits in the presence of water electrolyte.

The "printed circuit" technology makes it possible to produce a "Faraday cage"-type structure which allows the circuits located on the inside to be electrically isolated and thus the problem of crosstalk from one component to another to be eliminated.

This results in an electronic component able to contain radiofrequency functions which ensures sealtight properties for protecting encapsulated technologies which are sensitive to moisture, such as MMIC technologies. The invention provides better reliability of mounting in comparison with the current state of the art so as to be commensurate with the level of integration. The invention also makes it possible to minimize crosstalk problems, so as to be able to position the functions in the most integrated manner possible. Therefore, the invention makes it possible to provide heat dissipation commensurate with the required level of integration. Lastly, with an electronic component according to the invention, it is possible to have the three-dimensional mechanical characteristics which provide a good capacity for stacking radiofrequency functions.

The advantage of the invention is that it improves the sealtightness of the component, in a general manner and in complement to EP3089211. Additionally, this type of solution represents an alternative to ASICs, MMICs, etc., has lower NRCs (non-recurring costs) for development than other solutions known from the prior art and constitutes a robust solution.

The invention claimed is:
1. A process for producing an electronic component comprising a first set comprising an interconnect layer and an electronic circuit having a front face and a back face, which is connected to the interconnect layer by the front face, the process comprising the following steps:
  a. joining a metal plate having a front face and a back face to the back face of the electronic circuit;
  b. thermally and electrically coupling the metal plate to the electronic circuit using a coupling agent between the front face of the metal plate and the back face of the electronic circuit, the coupling agent being an adhesive or a metal alloy solder;
  c. stacking a plurality of layers made of thermoplastic materials around the first set and the metal plate using a printed circuit-type technique and encapsulating the electronic circuit forming an assembly;

d. laminating the assembly, by applying pressure and heat to the plurality of layers made of thermoplastic materials, the electronic circuit being thereby embedded in the thermoplastic materials;

e. producing a thermally conductive metal surface arranged at least partially in contact with the back face of the metal plate, and protecting the back face of the electronic circuit, reconnecting the back face of the electronic circuit by the thermally conductive metal surface, and forming an electric contact with the metal plate, wherein step e. comprises a step of machining the electronic component towards the back face of the metal plate and a metallization step.

2. The production process according to claim 1, comprising a step of producing shielding for the electronic circuit using an array of metal elements arranged at a distance from the electronic circuit so as to form a Faraday cage containing the electronic circuit.

3. The production process according to claim 2, wherein the step of producing shielding for the electronic component comprises a step of arranging the array of metal elements on an outer lateral periphery of the electronic component.

4. The production process according to claim 2, wherein the step of producing shielding for the electronic component comprises a step of arranging the array of metal elements on a periphery of the electronic component.

5. An electronic component comprising a first set comprising an interconnect layer and an electronic circuit having a front face and a back face, which is connected to the interconnect layer by the front face, wherein the first set comprises:

a. a metal plate having a front face and a back face joined to the back face of the electronic circuit;

b. a coupling agent between the front face of the metal plate and the back face of the electronic circuit, configured to thermally and electrically connect the metal plate to the electronic circuit, the coupling agent being an adhesive or a metal alloy solder;

and in that the electronic component is machined towards the back face of the metal plate and comprises:

c. a plurality of layers made of thermoplastic materials stacked around the first set using a printed circuit-type technique and encapsulating the electronic circuit, and uniformized by applying pressure and heat to the plurality of layers made of thermoplastic materials, the electronic circuit being thereby embedded in the thermoplastic materials;

d. a thermally conductive metal surface arranged at least partially in contact with the back face of the metal plate, thereby protecting the back face of the electronic circuit, the thermally conductive metal surface being configured to reconnect the back face of the electronic circuit, thereby forming an electric contact with the metal plate.

6. The electronic component according to claim 5, comprising an array of metal elements arranged at a distance from the electronic circuit so as to form a Faraday cage containing the electronic circuit.

7. The electronic component according to claim 6, wherein the array of metal elements is arranged on an outer lateral periphery of the electronic component.

8. The electronic component according to claim 6, wherein the array of metal elements is arranged on a periphery of the electronic component.

* * * * *